(12) United States Patent (10) Patent No.: US 12,181,499 B2
Bergogne et al. (45) Date of Patent: Dec. 31, 2024

(54) DETECTOR FOR DETECTING THE POLARITY OF AN ALTERNATING SIGNAL

(71) Applicant: COMMISSARIAT A L'ENERGIE ATOMIQUE ET AUX ENERGIES ALTERNATIVES, Paris (FR)

(72) Inventors: Dominique Bergogne, Grenoble (FR); Frédéric Rothan, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 141 days.

(21) Appl. No.: 18/042,122

(22) PCT Filed: Sep. 1, 2021

(86) PCT No.: PCT/FR2021/051506
§ 371 (c)(1),
(2) Date: Feb. 17, 2023

(87) PCT Pub. No.: WO2022/049344
PCT Pub. Date: Mar. 10, 2022

(65) Prior Publication Data
US 2023/0314486 A1 Oct. 5, 2023

(30) Foreign Application Priority Data
Sep. 7, 2020 (FR) ...................................... 2009047

(51) Int. Cl.
*G01R 19/14* (2006.01)
*G01R 1/20* (2006.01)
(Continued)

(52) U.S. Cl.
CPC ....... *G01R 19/14* (2013.01); *G01R 19/16519* (2013.01); *H03K 5/24* (2013.01)

(58) Field of Classification Search
CPC .......... G01R 1/20; G01R 31/02; G01R 31/26; G01R 31/27; G01R 31/28; G01R 31/30; G01R 31/302; G01R 19/14; G01R 19/165
See application file for complete search history.

(56) References Cited

U.S. PATENT DOCUMENTS 4,525,678 A 6/1985 Lehmann et al.
5,541,799 A 7/1996 Schmidt et al.
(Continued)

FOREIGN PATENT DOCUMENTS

EP 2 515 126 A1 10/2012
JP 10-51272 A 2/1998

OTHER PUBLICATIONS

International Search Report & Written Opinion issued Dec. 1, 2021 in PCT/FR2021/051506, filed on Sep. 1, 2021, 22 pages.
(Continued)

*Primary Examiner* — Neel D Shah
(74) *Attorney, Agent, or Firm* — Oblon, McClelland, Maier & Neustadt, L.L.P.

(57) ABSTRACT

A device for detecting the polarity of a current or voltage, the detection device including a circuit portion with a detection node configured to produce at the detection node a measurement voltage which is an image of a fraction of the detected current or voltage, and a detection circuit with transistor(s), coupled to the detection node, and provided with amplifier(s), with a comparator transistor having a source gate voltage which depends on the measurement voltage. The comparator transistor further includes a source set at a first fixed potential and a source-gate voltage which depends on the measurement voltage or a gate set at a second fixed potential and a source-gate voltage which depends on the measurement voltage, the detection circuit being configured to compare the measurement potential with a thresh-
(Continued)

old and to output a binary detection signal indicating the polarity of the detected current or voltage.

13 Claims, 6 Drawing Sheets

(51) Int. Cl.
    *G01R 19/165* (2006.01)
    *G01R 31/26* (2020.01)
    *G01R 31/27* (2006.01)
    *G01R 31/28* (2006.01)
    *H03K 5/24* (2006.01)

(56) References Cited

U.S. PATENT DOCUMENTS

| | | |
|---|---|---|
| 5,579,193 A | 11/1996 | Schmidt et al. |
| 2005/0286194 A1 | 12/2005 | Fujiki et al. |
| 2012/0268075 A1 | 10/2012 | Wolf et al. |
| 2015/0003843 A1 | 1/2015 | Zhou et al. |
| 2017/0150566 A1* | 5/2017 | Vanderzon ......... G01R 19/1659 |
| 2018/0238937 A1 | 8/2018 | Nakajima |
| 2019/0140630 A1 | 5/2019 | Chen et al. |
| 2019/0245382 A1 | 8/2019 | Liu et al. |
| 2020/0028381 A1 | 1/2020 | Liu et al. |

OTHER PUBLICATIONS

Predrag B. Petrovic, "New CMOS Current-Mode Analogue to Digital Power Converter", Circuits Systems Signal Process (2017) vol. 36, No. 4, pp. 1361-1378.

Anonymous. "Inverter (logic gate)—Wikipedia" Mar. 15, 2020 (Mar. 15, 2020). Retrieved from the Internet: https://en.wikipedia.org/w/index.php?title=Inverter_(logic_gate)&oldid=945667015[retrieved on Nov. 18, 2021], XP055863183, 4 pages.

Fay P et al., "High sensitivity 12 Gb/s monolithically integrated pin-HEMT photoreceivers" Indium Phosphide and Related Materials, 1998 International Conference on Tsukuba, Japan May 11-15, 1998, New York, NY, USA, IEEE, US, May 11, 1998 (May 11, 1998), pp. 439-442, XP010295314.

Xavier de Frutos, "Fully Protected H-Bridge IR3220S Architecture and Typical Application", Application Note AN-1032, 2001, 10 pages.

"Current Sensing Power MOSFETs", Semiconductor Components Industries, Mar. 2017, 13 pages.

L. Di Cioccio et al., "From epitaxy to converters topologies what issues for 200 mm GaN/Si?", IEDM 15-426, 2015, 4 pages.

\* cited by examiner

DETECTOR FOR DETECTING THE POLARITY OF AN ALTERNATING SIGNAL

TECHNICAL FIELD

The present invention relates to the field of electronic circuits for detecting current or voltage and in particular to circuits for detecting the polarity of an alternating current or an alternating voltage. In particular, it aims at a current detection device for indicating the polarity of the current provided by a power transistor such as a HEMT (High Electron Mobility Transistor).

PRIOR ART

Heterojunction power transistors, such as GaN HEMT transistors, especially have the advantage of having low electrical resistance in the on state and of withstanding high current densities and high voltages in the off state. They have applications especially in the field of electrical energy converters, DC/DC converters, AC/DC converters based on bidirectional switches, USB-PD (Universal Serial Bus Power Delivery) power supplies.

For some applications, it is desirable to detect whether a current flowing through the power transistor exceeds a given threshold and in particular whether or not this current is positive.

Document "Fully Protected H-Bridge IR3220S", Architecture and Typical Application, Application Note AN-1032, Xavier de Frutos, 2001 provides, for example, a circuit for detecting a positive current provided by a power transistor and which uses the transistor's on-state resistance.

The detection circuit set forth in this document is sensitive to resistance variations as a function of temperature.

In order to achieve the same type of detection, document "Current Sensing Power MOSFETs Semiconductor" Application Note AND8093/D, 2002, Semiconductor Components Industries, LLC, 2002, in turn provides for the shunt of a tiny part of the current from cells forming a power transistor to a detection circuit formed by operational amplifiers. Such a detection circuit rises problems of overall size. Furthermore, the operational amplifiers are associated with a bias circuit providing negative voltages, which requires the integration of additional circuit portions to ensure this type of bias.

The problem arises of finding a new device for detecting current from a power transistor which is improved in particular with respect to at least one of the drawbacks mentioned above.

DISCLOSURE OF THE INVENTION

According to one aspect, the present application relates to a device for detecting the polarity of an alternately positive and negative so-called "detected" current or of an alternately positive and negative so-called "detected" voltage, said detection device being capable of indicating the polarity of said detected current or said detected voltage, the detection device comprising:

a circuit portion with a so-called "detection" node configured to produce at said detection node a so-called "measurement" voltage which is the image of a fraction of said detected current or said detected voltage, at least one detection circuit with transistors, coupled to said detection node, said at least one detection circuit being provided with one or more amplifier stages, at least one of said amplifier stages comprising a so-called "comparator" transistor having a source gate voltage which depends on said measurement voltage, said comparator transistor further having a source set at a fixed potential (GND) and a source gate voltage which depends on said measurement voltage or a gate set at a fixed potential and a source gate voltage which depends on said measurement voltage, said detection circuit being configured to compare said measurement potential with a determined threshold and to output a binary detection signal indicating the polarity of the detected current or the polarity of the detected voltage, said detection signal adopting a first state when said measurement voltage is below the determined threshold and adopting a second state when said measurement voltage is above the determined threshold.

Advantageously, the transistor(s) of said at least one detection circuit are N-type transistors. The detection circuit may thus consist of N-type transistors and bias loads formed by resistors and/or transistors.

The transistors of the detection circuit may in particular be HEMT transistors provided with a channel structure made of at least one GaN layer.

According to one preferred embodiment, said detection node is coupled to the source of an input transistor of the detection circuit, the input transistor of the detection circuit being the comparator transistor or a transistor coupled to the comparator transistor.

Typically, the determined voltage threshold is equal to 0 volt or close to 0 volt. By close to 0 volt it is meant equal in absolute value to less than 20% of the supply voltage Vdd and typically less than 10% of the supply voltage Vdd.

According to one particular aspect, the present application relates to a device for detecting current from a power transistor, said current detection device being capable of indicating when the detected current does or does not reach at least a first given current level, the detection device comprising:

a circuit portion comprising a so-called "detection" node coupled to said power transistor and configured to produce at said detection node a so-called "measurement" voltage, which is an image of a fraction of said current flowing through said power transistor, at least one detection circuit with transistor(s), coupled to said detection node, said at least one detection circuit being provided with one or more amplifier stages, at least one of said amplifier stages comprising a so-called "comparator" transistor having a source gate voltage which depends on said measurement voltage, said detection circuit being configured to compare said measurement voltage with a determined threshold and to output a two-state detection signal indicating when said detected current reaches said first given current level, said detection signal adopting a first state when said measurement voltage is below the determined threshold and adopting a second state when said measurement potential is above the determined threshold.

Advantageously, the detection circuit further comprises a so-called "output" transistor having a drain coupled to said output and a gate coupled to the drain of said comparator transistor.

According to one particular aspect, the present application relates to a device for detecting current from a power transistor, said current detection device being capable of indicating when the detected current does or does not reach at least a first given current level, the detection device comprising:

a circuit portion comprising a so-called "detection" node coupled to said power transistor and configured to produce at said detection node a so-called "measurement" voltage, which is an image of a fraction of said current flowing through said power transistor, at least one detection circuit with transistor(s), coupled to said detection node, said at least one detection circuit being provided with one or more amplifier stages, at least one of said amplifier stages comprising a so-called "comparator" transistor having a source gate voltage which depends on said measurement voltage, said detection circuit being configured to compare said measurement voltage with a determined threshold and to output a two-state detection signal indicating when said detected current reaches said first given current level, said detection signal adopting a first state when said measurement voltage is below the determined threshold and adopting a second state when said measurement potential is above the determined threshold.

According to one possible implementation of the device, the power transistor is a HEMT transistor provided with a GaN-based channel structure.

In this case, advantageously, the transistor(s) of said at least one detection circuit may also be HEMT transistors provided with a channel structure made of at least one GaN layer. Implementing the power transistor and the detection circuit in a same technology can especially allow for co-integration in the same chip and thus gain in compactness.

According to one possible implementation, the power transistor, the circuit portion provided with the detection node, and said detection circuit(s) may be integrated on a same substrate.

Typically, the detection circuit comprises a so-called "output" transistor having a drain coupled to said output, said output transistor having a gate coupled to the drain of said comparator transistor. Such an output transistor may be used to shape the signal resulting from the detection and to obtain a square-wave signal.

Advantageously, the output transistor and said comparator transistor of said detection circuit are of the normally off type.

According to one particular implementation of the device, the detection node can be coupled to the source of a so-called "input" transistor of said detection circuit. Such a configuration may enable an amplification chain with a low input impedance to be obtained.

In a first embodiment of the detection device, the first given current level is a positive current level. In this case, the detection circuit produces, at said output, a detection signal indicating a positive current detection. The amplifier stage(s) typically form a positive gain amplifier chain.

According to one particular implementation of this first embodiment, the detection node is coupled to the source of a so-called "input" transistor of said detection circuit, said input transistor being provided with a drain electrode coupled to the gate of said comparator transistor, said comparator transistor having a source set to a fixed potential.

Advantageously, the input transistor may be connected as a diode.

Advantageously, the input transistor may be a normally off type transistor, which may facilitate the adjustment of the detection threshold.

In a second embodiment, the first given current level is a negative current level, whereby said detection circuit outputs a detection signal indicating a negative current detection.

The amplifier stages may in this case form a negative gain amplifier chain.

According to one possible implementation of this second embodiment, the detection node is coupled to the source of the comparator transistor, said comparator transistor being connected as a common gate. The gate of the comparator transistor may then be coupled to a transistor connected as a diode.

According to another possible implementation of this second embodiment, the detection node may be coupled to the gate of a so-called "input" transistor of said detection circuit, the input transistor having a drain coupled to the gate of said comparator transistor.

According to a third embodiment of the detection device, the detection circuit is provided with a so-called "input" transistor whose either source or gate electrode may be coupled to the detection node. The choice of the electrode to which the measurement voltage is injected depends on whether it is desired to detect a positive or negative current level.

Advantageously, for this third embodiment, said input transistor may be provided with a drain electrode coupled to the gate of said comparator transistor and to a transistor forming an active load.

According to another possible implementation, the first given current level of said detected current may be a positive current level, whereby said detection circuit produces a detection signal indicating a positive current detection. In this case, the device may be further provided with at least a second detection circuit, said second detection circuit with transistor(s) being provided with at least one amplification stage comprising at least one comparison transistor whose source gate voltage depends on said measurement voltage, said second detection circuit being configured to output another two-state detection signal, said other detection signal being a two-state signal capable of indicating when said detected current is negative.

The detection circuit typically comprises a circuit for biasing the transistors. Advantageously, this bias circuit is supplied only with a positive supply voltage, which again makes it possible to gain in compactness.

Also, advantageously, the detection circuit can be configured so that said first state and said second state correspond to positive voltage levels of said detection signal. Such a signal has the advantage of being easily utilised downstream, in particular by a digital processing circuit.

BRIEF DESCRIPTION OF THE DRAWINGS

The present invention will be better understood based on the following description and the appended drawings in which.

Identical, similar or equivalent parts of the various figures bear the same reference numerals in order to facilitate switching from one figure to another. The different parts represented in the figures are not necessarily drawn to a uniform scale, to make the figures more legible.

DETAILED DISCLOSURE OF PARTICULAR EMBODIMENTS

A device, as implemented according to one embodiment of the present invention, for detecting a current level of a power transistor will now be described.

Detection is carried out from a measurement voltage which is an image of a fraction of the current flowing through the power transistor. In particular, a detection of the polarity of the current is implemented by detecting a threshold crossing of this measurement voltage, in particular a zero or near-zero crossing, using a circuit forming at least one amplifier, preferably with a high gain, and which is typically fitted with at least one transistor connected as a common source or common gate and which receives the measurement voltage or a voltage which depends on the measurement voltage.

The detection device is preferably configured to provide an output signal of the all-or-nothing type, in other words a binary or two-state signal, depending on whether or not a given current level provided by the power transistor is detected. The output signal is thus usable by a digital circuit. This output signal adopts one state, in other words a voltage level, when the current is less than a given current level, and adopts another state, in other words another voltage level, when the current exceeds the given current level.

The power transistor may in particular be an N-type transistor and likely to provide a bidirectional current, in other words, which may be positive or negative. The power transistor is advantageously a heterostructure field effect transistor, typically a high electron mobility transistor (HEMT) whose structure includes two semiconductor materials with different band gaps.

Figure 1:
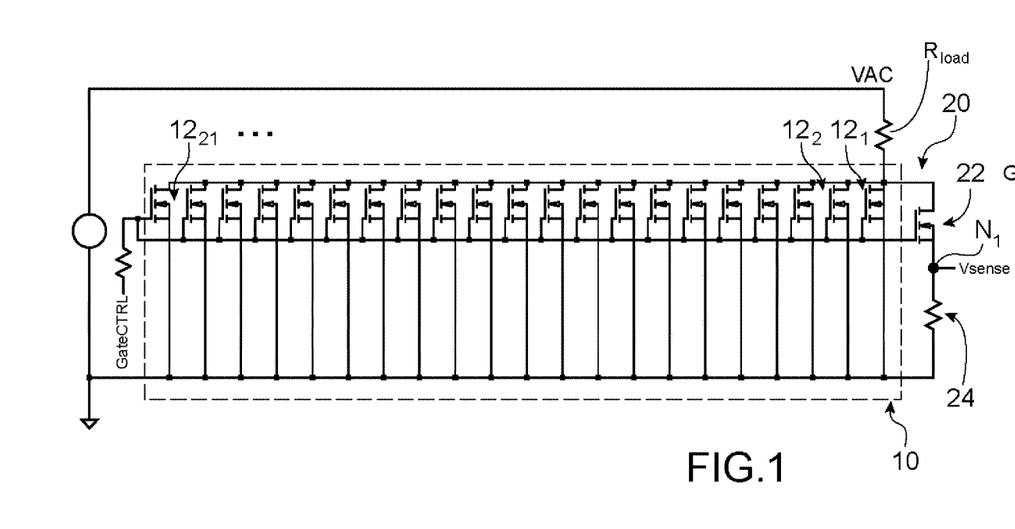
FIG. 1 is used to illustrate a current detection device as implemented according to one embodiment of the present invention and fitted with a circuit with transistor forming an amplification chain for detecting when the current flowing through the power transistor is positive.

In the exemplary embodiment illustrated in FIG. 1, the power transistor 10 considered is a GaN HEMT transistor, that is provided with a channel structure at least partly made of a GaN layer. This transistor 10 may be formed of a plurality of parallel cells represented as a plurality of transistors $12_1, \ldots, 12_{21}$ arranged in parallel and sharing a common drain electrode and a common source electrode. Document by L. Di Cioccio et al, "From epitaxy to converters topologies what issues for 200 mm GaN/Si?," 2015 IEEE International Electron Devices Meeting (IEDM), Washington, DC, 2015, pp. 16.5.1-16.5.4, doi: 10.1109/IEDM.2015.7409712, introduces a technological implementation of such a transistor type.

A fraction of the drain current from the transistor 10 is converted via a current-to-voltage conversion stage 20. This stage 20 is here provided with a resistive element 24 which is placed in series with a transistor 22, typically of the same type as transistors $12_1, \ldots, 12_{22}$. Part of the drain current of the power transistor 10 is thus shunted and returns to a node common to the transistors $12_1, \ldots, 12_{22}$.

A so-called "detection" node $N_1$, coupled to the source of transistor 22 and located between transistor 22 and resistor 24, makes it possible to produce a so-called "measurement" voltage $V_{sense}$, which is the image of that fraction of the current whose polarity it is desired to detect or whose level it is desired to verify whether or not it exceeds a given level.

The measurement voltage $V_{sense}$, which is the image of a part of the current to be detected, is applied to the input of a detection circuit 30 with transistors $M_{36}$, $M_{37}$, $M_{38}$ forming a multi-stage amplifier or a chain of amplifiers.

For example, the level of the measurement voltage $V_{sense}$ may be less than 100 mV for a maximum current flowing through the power transistor in the order of 1A.

Preferably, a resistor 24 with a large $V_{sense}$ value, for example at least 10 to 100 times that of the resistor $R_{ON\_mes}$ in the on state of the transistor 22, is chosen here in order to shunt a small amount of current from the power transistor.

For example, in the case where the resistor $R_{ON\_mes}$ in the on state of transistor 22 is in the order of 10 Ohms, resistor 24 may be provided in the range of 100 ohms to 1 kΩ. Typically, the equivalent resistor Ron in the on state of the transistors $12_1, \ldots, 12_{22}$ connected in parallel is less than 10 Ohms in order to ensure high efficiency of the power converter.

The detection circuit 30 is in particular adapted to a wide range of measurement voltages $V_{sense}$, which range may depend on variations in the method for manufacturing the power transistor 10 used.

The detection circuit 30 is here a so-called "positive voltage detection" circuit, and operates in an open loop. In this exemplary embodiment, the positive voltage detection circuit 30 enables a positive current to be detected by detecting a crossing above zero of the measurement voltage $V_{sense}$. The amplifier chain thus has an overall positive gain.

The detection circuit 30 is in particular provided with a first transistor $M_{36}$, called "input transistor" receiving the measurement signal $V_{sense}$, followed by a second transistor $M_{37}$ connected as a common source, followed by a third transistor $M_{38}$ called "output transistor", which produces a two-state signal $OUT_p$, likely to alternate between a voltage, for example in the order of 0 Volt, and another voltage for example in the order of at least 3 Volts.

The transistors $M_{36}$, $M_{37}$, $M_{38}$ are preferably of the same type as the power transistor 10, in particular HEMT transistors, typically with a GaN-based channel structure. The transistors $M_{36}$, $M_{37}$, $M_{38}$ can thus be integrated on a same substrate and made in a same technological stack as the power transistor 10. The power transistor 10 and its associated detection circuit 30 can thus be advantageously co-integrated in a same chip in order to gain in compactness.

The transistors $M_{37}$, $M_{38}$ are typically normally off (n-off) transistors or enhancement transistors, that is with a positive threshold voltage and which are off when their source gate voltage is zero. The use of this type of transistor ensures a suitable gate bias level in order to provide a sufficient level of output voltage. In this example, transistors $M_{37}$, $M_{38}$ withstand a gate voltage in the order of the drain voltage of transistor $M_{36}$, that is, a voltage in the order of 1.5V.

The circuit for biasing transistors $M_{36}$, $M_{37}$, $M_{38}$ is here provided with a positive supply voltage VDC, for example in the order of 6 volts, and resistors $R_{32}$, $R_{33}$, $R_{34}$, $R_{35}$, $R_{36}$. This bias circuit is preferably provided in such a way as to operate the transistors $M_{36}$, $M_{37}$, $M_{38}$ in saturation, in particular by making a suitable choice of resistors $R_{32}$, $R_{34}$, $R_{36}$. The resistors $R_{33}$ and $R_{35}$ make the circuit less sensitive to technological variations. These resistors are optional and can be dispensed with in particular when the overall gain of the connection is to be favoured.

The circuit branches 31, 32, containing the transistor $M_{36}$ and transistor $M_{37}$ respectively are here provided with identical resistors $R_{32}$, $R_{34}$, with $R_{32}=R_{34}=R_L$ for example in the order of 10 kΩ to 40 kΩ so as to achieve a bias of the transistors $M_{36}$, $M_{37}$ in saturation, so as to obtain a maximum gain and a low current detection threshold. For example, resistors $R_{36}$, $R_{33}$, $R_{35}$, respectively of 7.5 kΩ, 50Ω and 100Ω can be provided. The resistors $R_{32}$ and $R_{34}$ are not necessarily identical. In practice, a maximum gain is sought for each stage, and so in the illustrated example each branch is biased in the same way, the optimum being the same for all stages.

The measurement voltage $V_{sense}$, which is the image of a part of the current to be detected, is applied to the branch 31 and in particular to the input transistor. The variations in the measurement voltage $V_{sense}$ introduce an imbalance between the branches 31, 32 and in particular between the potentials GGbias and VDtect which are used for the detection.

The measurement voltage $V_{sense}$ is, in this example, applied to the source of the input transistor $M_{36}$ via the resistor $R_{33}$, which makes it possible to obtain an amplification chain with a low input impedance. Resistor $R_{33}$ can be dispensed with when it is desired to increase the gain and thus sensitivity of the system, and to decrease (in absolute value) the current detection threshold.

In the particular exemplary embodiment illustrated in FIG. 1, the input transistor $M_{36}$ is also a normally off transistor, which facilitates adjustment of the detection threshold of the circuit, this threshold depending on the different bias points imposed on the transistors.

The input transistor $M_{36}$ is connected as a diode with a gate electrode connected to its drain and produces, at the drain electrode, a potential GGbias which depends on the measurement voltage $V_{sense}$. This potential GGbias is applied to the gate of the so-called "comparator transistor" $M_{37}$.

The comparator transistor $M_{37}$ here has a source coupled to ground via resistor $R_{35}$ and thus connected to a fixed or substantially fixed potential. Its source gate voltage, which determines its conduction state, on or off, thus depends on the time course of the measurement voltage $V_{sense}$. The comparator transistor $M_{37}$ produces a potential VDtect on its drain, which is itself coupled to the gate of a so-called "output" transistor $M_{38}$, the drain of transistor $M_{38}$ producing the output signal $OUT_p$. The output transistor $M_{38}$ produces a square-wave or binary signal $OUT_p$ indicating, depending on its state, a positive polarity of the current of the power transistor 10. The output signal $OUT_p$ is here a positive voltage which is between GND and VDC, the signal being here at GND, for example 0 volt, when the detection threshold is not reached and here at VDC, typically above 3 volts, when the detection threshold is reached.

Figure 2:
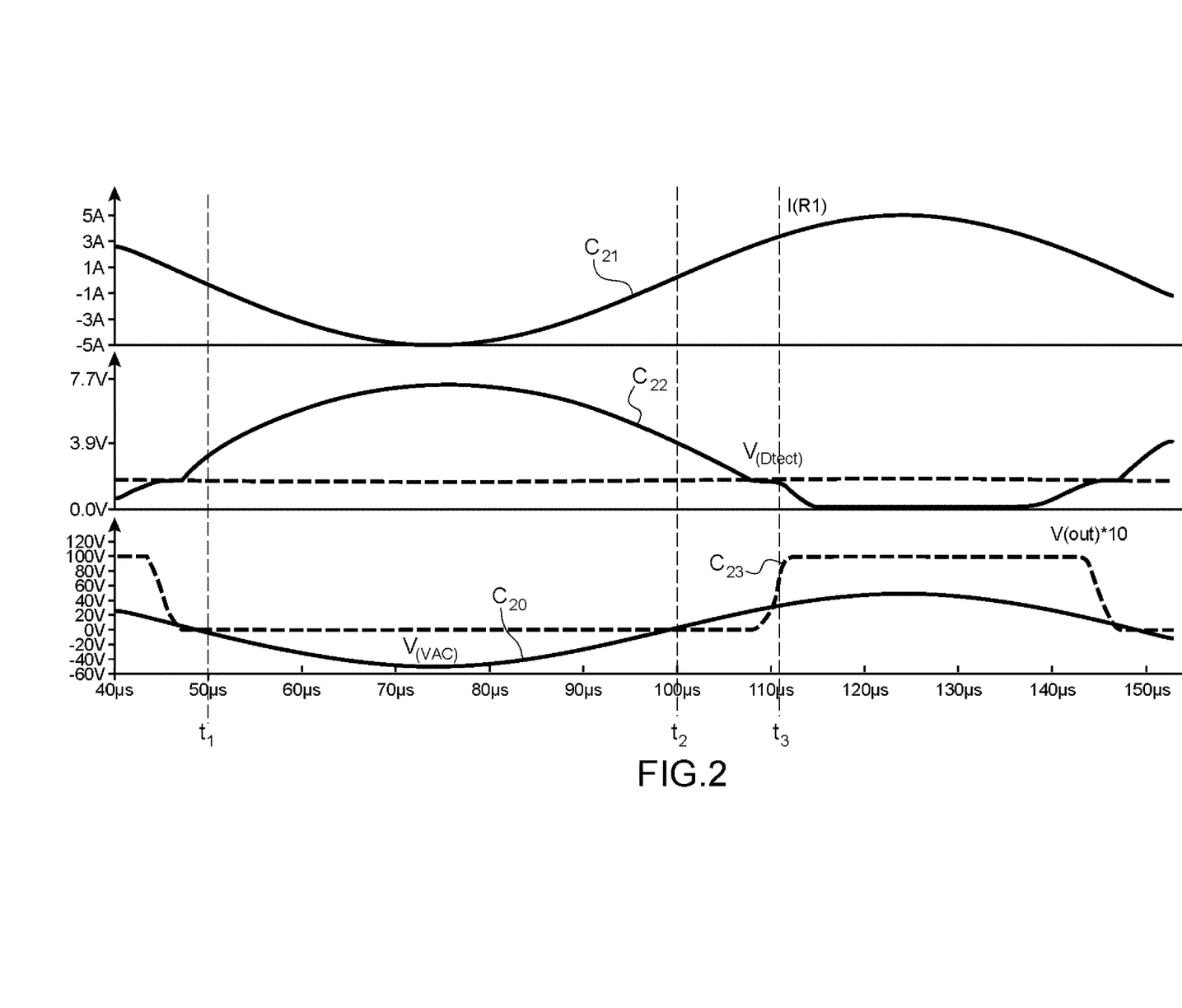
FIG. 2 is used to illustrate various signals implemented within the detection device of FIG. 1.

FIG. 2 is used to illustrate the operation of the detection circuit 30 previously described when a sinusoidal test signal VAC alternating between negative and positive values is applied to the power transistor 10 using a gate driver (not represented) which accepts a low power signal and produces a higher power control input GateCTRL to control the gate of the transistor 10.

This causes an alternately negative and positive current flow through the power transistor 10.

Curves $C_{20}$, $C_{21}$, $C_{22}$, $C_{23}$ are respectively representative of the test signal VAC, the current I(R1) flowing through the power transistor 10, the potential V(Dect) of the node Dtect produced by transistor $M_{37}$ and provided to the gate of output transistor $M_{38}$, and the all-or-nothing output signal $OUT_p$ of the detection circuit 30.

At a time $t_1$, the current level is negative and therefore less than the current level desired to be detected.

The source gate voltage of the comparator transistor $M_{37}$ is such that this transistor $M_{37}$ is in a state close to the off state, so that the gate of the output transistor $M_{38}$ is raised to a voltage close to the higher supply voltage VDC and thus set at a voltage higher than the threshold voltage of this transistor $M_{38}$. The transistor $M_{38}$ consequently has a source gate voltage placing it in a given conduction state, here an on state, so that the signal $Out_p$ at the output of the circuit 30 is at a first voltage level, here at ground GND, corresponding to a first state, indicating that the detected current is below the detection level.

When, at a time $t_2$, the current rises above the detection level, in particular changes sign and rises to a positive current level, the measured voltage Vmes also changes sign and becomes positive, which modifies the source gate voltage of the comparator transistor $M_{37}$ and modifies its conduction state when the detection threshold is exceeded (time $t_3$), this detection threshold is therefore not placed here at 0 A, but at a slightly higher current level.

The transistor $M_{37}$ switches to another state, here on, which changes the drain potential of the comparator transistor $M_{37}$ applied to the gate of the output transistor $M_{38}$ and causes it to decrease, resulting in a change in the source gate voltage of the output transistor $M_{38}$ so as to change the conduction state of the transistor $M_{38}$. The output transistor $M_{38}$ switches to another conduction state, here off. The output $OUT_p$ is then coupled to the supply voltage VDC, the output signal $OUT_p$ being then at a second voltage level corresponding for example to a logic level '1' indicating that the detected current is above the detection level and in particular positive.

Figure 3:
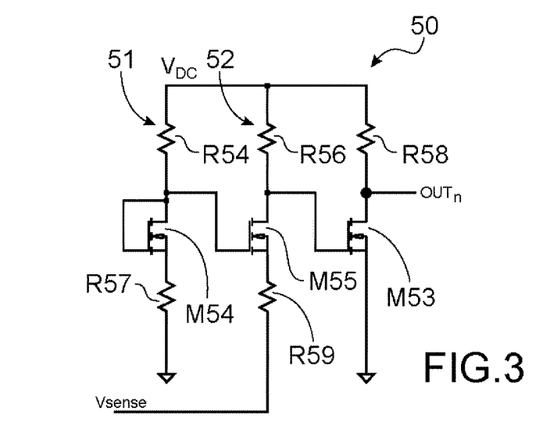
FIG. 3 is used to illustrate another embodiment of the current detection device, fitted this time with a detection circuit for detecting when the current flowing through a power transistor is negative.

One alternative current detection circuit is shown in FIG. 3.

The circuit 50, here called negative voltage detection circuit, is also advantageously provided with transistors $M_{54}$, $M_{55}$, $M_{53}$, forming an amplifier chain. In this exemplary embodiment, the circuit 50 has an overall negative gain and in this case enables a negative current flowing through the power transistor 10 to be detected.

The transistors $M_{54}$, $M_{55}$, $M_{53}$ are also preferably of the same type as the power transistor 10, in particular GaN-based HEMT transistors, and may, again, advantageously be integrated on a same substrate and made in a same technological stack as the power transistor 10.

In this particular exemplary embodiment, the transistors $M_{54}$, $M_{55}$, $M_{53}$ are of the normally off type.

A particular feature of the circuit 50 here is that a circuit for biasing the transistors $M_{54}$, $M_{55}$, $M_{53}$ is provided, which operates only with a positive supply voltage VDC, for example in the order of 6 volts, and therefore no additional circuit element(s) are required.

The bias circuit, in this example provided with resistors $R_{54}$, $R_{56}$, $R_{58}$, $R_{57}$, $R_{59}$ is configured to bias the transistors $M_{55}$, $M_{53}$ in saturation. As in the exemplary embodiment described above, resistors $R_{57}$ and $R_{59}$ are optional and can be omitted if the gain of the circuit is to be preferred.

Advantageously, in order to ensure the same level of current $I_O$ in each of the branches 51, 52, 53 for biasing the transistors $M_{54}$, $M_{55}$, $M_{53}$, while having the best current sensitivity, it is possible to provide identical resistors $R_{54}$, $R_{56}$, $R_{58}$, with $R_{54}=R_{56}=R_{58}=R_L$.

This time, the detection node $N_1$ is coupled to the source of a comparator transistor $M_{55}$ whose gate is set at a fixed or constant potential VGGbias. The transistor $M_{55}$ has a source gate voltage, which again depends on the measurement signal $V_{sense}$, and in particular on its sign. To bias the gate of the comparator transistor $M_{55}$, a transistor $M_{54}$ connected as a diode is provided here, which lowers the source gate voltage at which the transistor $M_{55}$ switches. An output transistor $M_{53}$, whose gate is coupled to the drain of transistor $M_{55}$, produces the binary output signal $OUT_n$, whose state indicates whether or not the detected current is negative.

Preferably, a maximum ratio is sought between the gain of the common-gate connection and Ids, the current provided by the comparator transistor $M_{55}$. To determine the suitable bias conditions, the gain to current ratio of transistor $M_{55}$ can be determined as a function of its gate voltage, for different geometries. A current value I0 which maximises this ratio, and hence a gate-to-source voltage Vgs beyond which the transistor changes conduction state and a resistance value RL, are derived therefrom.

The circuit 50 can operate as follows: when the current level of the power transistor is positive, the gate-source voltage of the comparator transistor $M_{55}$ of the negative voltage detection circuit 50 is such that this transistor $M_{55}$ is in a given conduction state, in this case off. The gate of the output transistor $M_{53}$ is then coupled to the supply $V_{DC}$, this output transistor $M_{53}$ consequently having a source gate voltage placing it in a given conduction state, here an on state. A signal $OUT_n$ at the output of circuit 50 is at a first voltage level, here at ground GND corresponding to a first state, characterising for example a logic level '0'. The signal $OUT_n$ then indicates that a negative current has not been detected. The current flowing through the power transistor 10 changes sign and becomes negative, which causes a change in sign of the measurement voltage $V_{sense}$, which changes the source gate voltage of the comparator transistor $M_{55}$ and changes its conduction state. Here, transistor $M_{55}$ goes into an on state, so that the gate of output transistor $M_{53}$ is coupled to the input and depends on the level of the measurement voltage $V_{sense}$. This changes the source gate voltage of the output transistor $M_{53}$ and thus its conduction state, with transistor $M_{53}$ becoming off, so that the signal $OUT_n$ at the output is pulled towards the supply voltage VDC, with the signal $OUT_n$ then being in a second state, for example characterising a logic level '1'.

Figure 4:
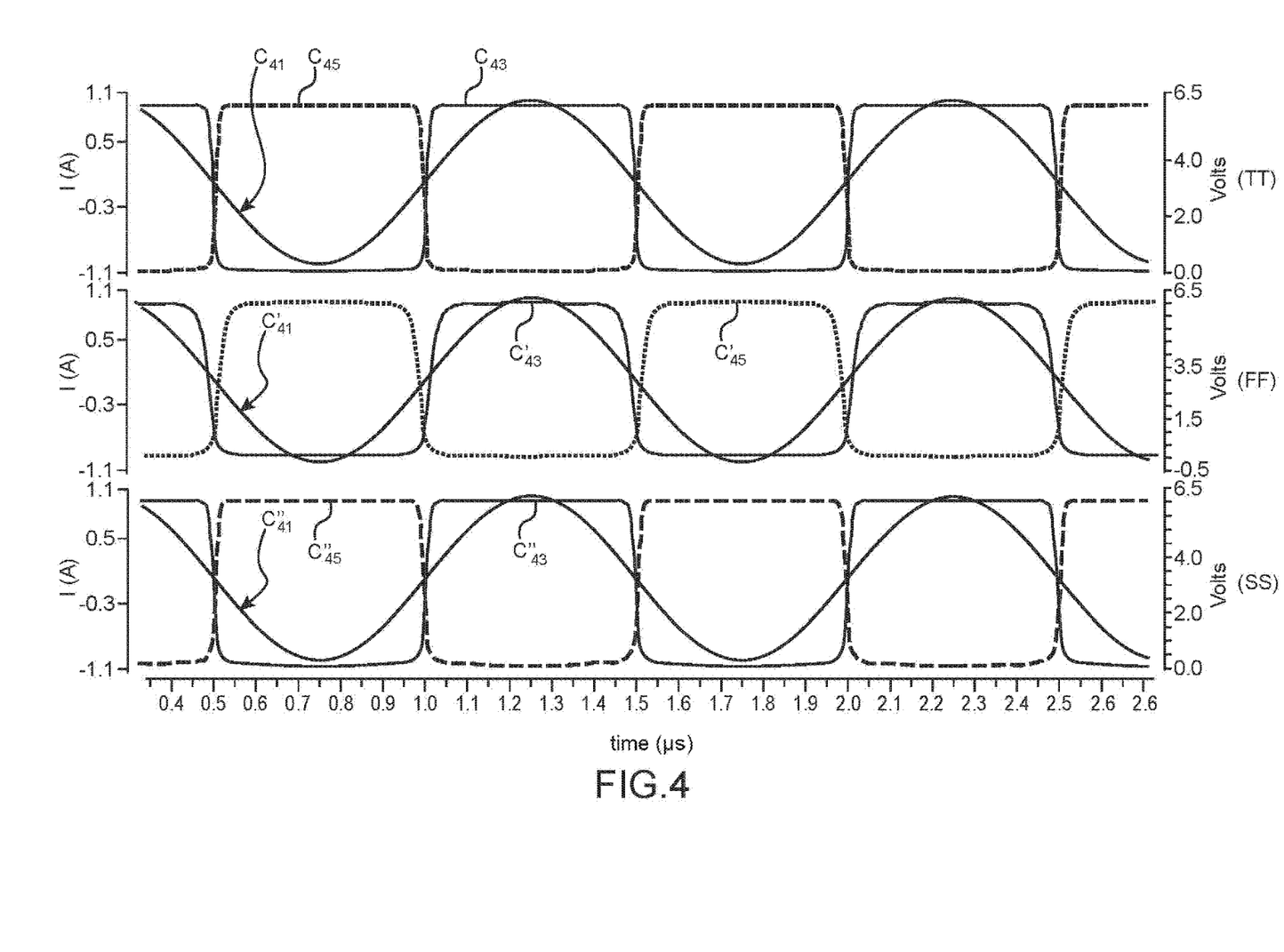
FIG. 4 is used to illustrate output signals from the positive current detection circuit and the negative current detection circuit, for different performance of the transistors in the amplifier chain.

Either of the detection circuits described above are robust to process variations, as shown in FIG. 4.

This figure shows simulation results of the operation of the circuits 30, 50 described above, for different performance of TT (for "typical-typical"), FF (for "fast-fast"), SS (for "slow-slow") transistors, representative of potential variations in the process-corners, where the curves $C_{41}$, $C'_{41}$, $C''_{41}$, are respectively representative of the current $I(R_1)$ flowing through the power transistor, the curves $C_{43}$, $C'_{43}$, $C''_{43}$, are representative of the signal $OUT_p$ provided by the positive voltage detection circuit, the curves $C_{45}$, $C'_{45}$, $C''_{45}$, of the signal $OUT_n$ provided by the negative voltage detection circuit. The size of the transistors has been optimised here to reduce power consumption. The overall consumption at a voltage of 6 volts is, for example, 660 µA for the TT transistors, 900 µA for the FF transistors, and 500 µA for the SS transistors.

Figure 5:
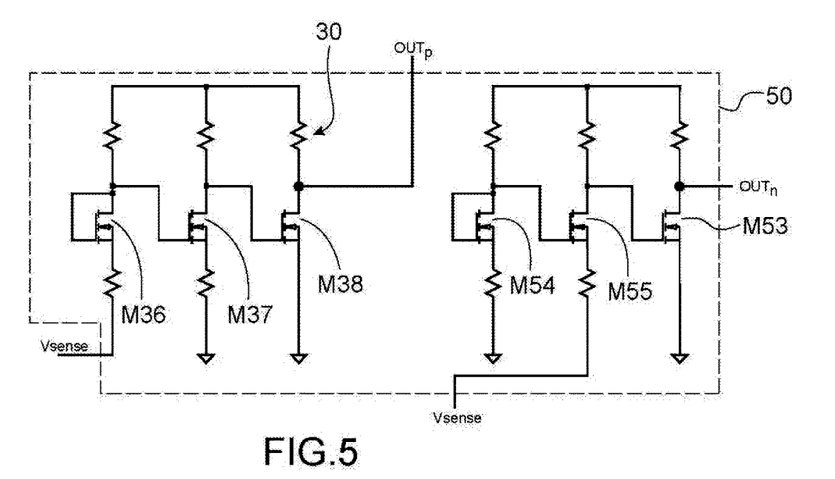
FIG. 5 is used to illustrate a current detection device fitted with both a negative current detection circuit and a positive current detection circuit.

The negative voltage detection circuit 50 may be used in combination with the positive voltage detection circuit 30 described above.

Thus, in the device illustrated in FIG. 5, the circuits 30, 50 are co-integrated in a same current detection device, and advantageously made on a same substrate as the positive voltage detection circuit 30 and, if applicable, the power transistor 10. A co-integration of the power transistor 10 and the detection circuits 30, 50 is thus provided in order to make a device able both to detect when the current flowing through the power transistor 10 has a negative intensity and when it has a positive intensity.

Another simulation result of the operation of a device including the two co-integrated circuits 30, 50 described above is given in FIG. 6, where the curves $C_{61}$, $C_{62}$, $C_{63}$, $C_{65}$ are respectively representative of the current $I(R_1)$ flowing through the power transistor, of the potential V(Dtect) emitted at the gate of the output transistor $M_{38}$, of the signal $OUT_p$ at the output of the positive voltage detection circuit 30, and of the signal $OUT_n$ at the output of the negative voltage detection circuit 50. This time, FIG. 5 illustrates one particular embodiment for which the two circuits 30, 50 are used concomitantly with a so-called "dead zone" detection range corresponding to current values around the value zero, for example between 0.7 A and −2.7 A, which are not detected.

Figure 6:
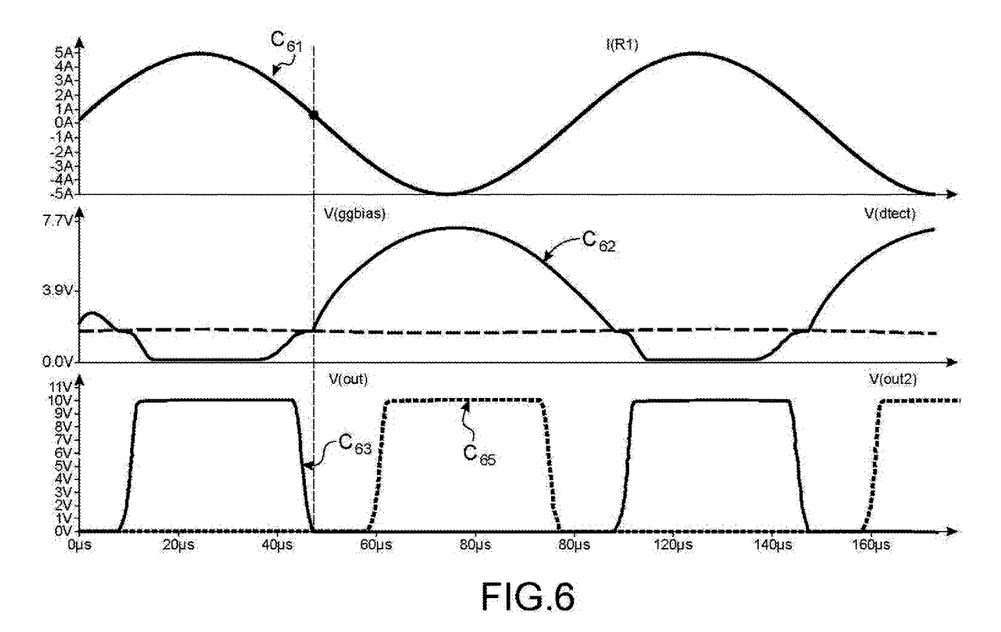
FIG. 6 is used to illustrate different signals implemented within a current detection device with negative and positive current detection.

This dead zone may be useful in some control systems, and may make it possible, for example, to prevent the simultaneous conduction of two devices that would be controlled respectively by the output $OUT_p$ and the output $OUT_n$ of the detection circuits 30, 50. Such a dead zone may be adjusted by modulating the respective dimensions of the transistors and/or the values of the resistors of the circuit for biasing the transistors, in particular the resistors $R_{33}$, $R_{35}$ of the detection circuit 30 or $R_{57}$, $R_{59}$ of the other detection circuit.

Figure 7:
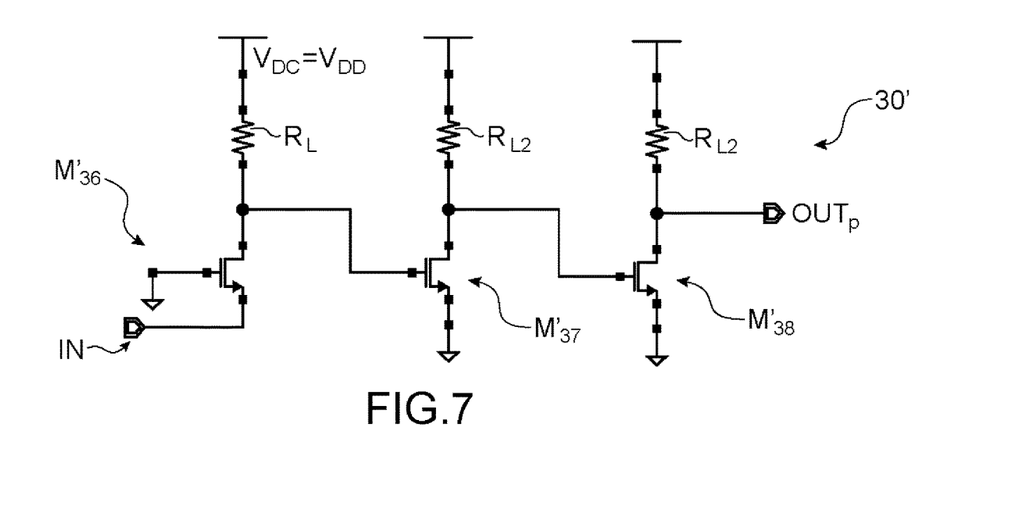
FIG. 7 is used to illustrate one alternative embodiment of the detection circuit for detecting a positive current.

One alternative embodiment of a detection circuit 30' adapted for positive current detection is shown in FIG. 7.

The detection circuit 30' is provided with transistors $M'_{36}$, $M'_{37}$, $M'_{38}$ which here also form a generally positive gain amplifier chain. The detection circuit 30' differs from the one previously described in connection with FIG. 1, especially by its input transistor $M'_{36}$, which in this example is normally on or n-on, that is on when its source gate voltage is zero. Transistors $M'_{37}$, $M'_{38}$ in turn can be normally off.

The input transistor $M'_{36}$, which receives the measurement voltage, is biased so that it is set in a saturation state, and produces a substantially constant current Ids which depends only on the geometry of the transistor. In order to be able to maintain this state, a resistance RL of the branch of the bias circuit to which the drain of transistor $M'_{36}$ is connected is preferably chosen to fulfil the following condition:

$$RL \leq (VDD - Vds)/Ids$$

where VDD is the value of the supply voltage of the bias circuit, Ids is the drain-source current of the transistor and Vds is its drain-source voltage.

The small signal gain Avo of the common gate amplification stage is in the order of $gm*R_L$ with gm, the transconductance of the transistor $M'_{36}$ and $R_L$ the resistance. It can be shown that $Av0=(gm/Ids)*(V_{dd}-V_{ds})$ provided that the following condition is met: $V_{ds} \geq V_{dssat}$, where $V_{dssat}$ is a technological parameter of the transistor which depends on its bias and geometry, and which can be obtained for example by simulation. The branches of the bias circuit to which the respective drains of transistors M'$_{37}$, M'$_{38}$ are connected may be provided with a resistance RL$_2$ different from the resistance R$_L$ insofar as their source drain voltage VDssat in saturated mode differs from that of the normally-on transistor. In order to maximise the gain, the factor gm/Ids should be maximised and Vds should be chosen to be equal to V$_{dssat}$ in order to keep the transistor M'$_{36}$ in saturation.

Figure 8:
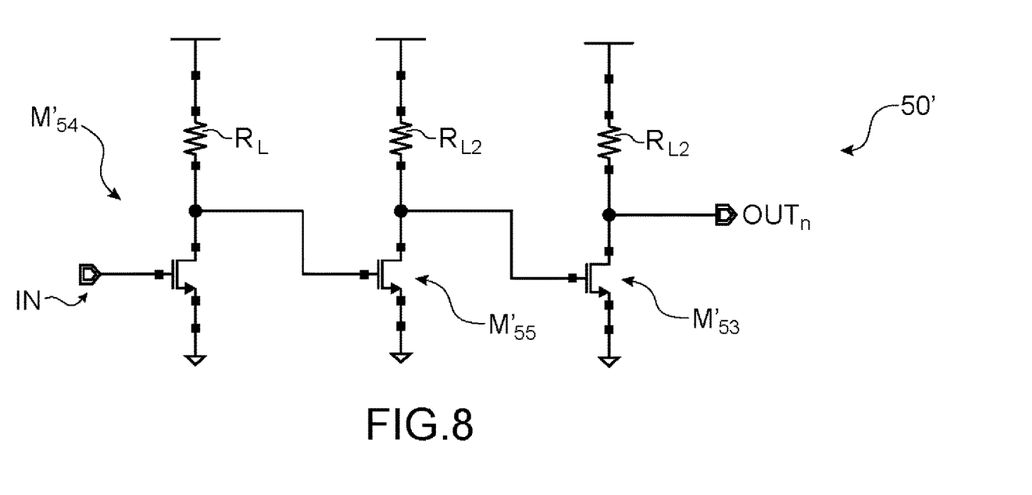
FIG. 8 is used to illustrate one alternative embodiment of the detection circuit for detecting a negative current.

One alternative embodiment, this time of the detection circuit adapted for negative current detection, is shown in FIG. 8.

The detection circuit 50' comprises transistors M'$_{54}$, M'$_{55}$, M'$_{53}$, which here form a generally negative gain amplification chain. The detection circuit 50' is provided with an input transistor M'$_{54}$, this time connected as a common source. This transistor M'$_{54}$ thus receives the measurement voltage V$_{sense}$ on its gate. Here the amplifier stage fitted with this transistor M'$_{54}$ has a negative amplification gain Avo in the order of –gm*R$_L$.

The input transistor M'$_{54}$ is normally on, that is, it is on when its source gate voltage is zero. Transistor M'$_{55}$ and output transistor M'$_{53}$ are normally off transistors also connected as a common source and having a similar arrangement to transistors M$_{55}$, M$_{53}$.

Figure 9:
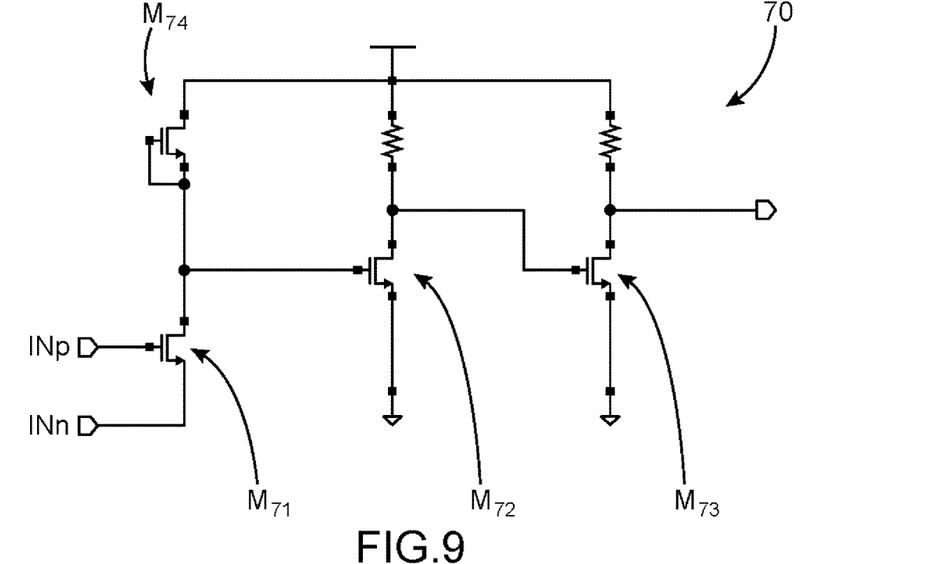
FIG. 9 is used to illustrate one alternative embodiment of a current detection circuit that can be adapted to either negative or positive current detection.

Another exemplary detection circuit 70 is shown in FIG. 9, with an output transistor M$_{73}$ and a comparator transistor M$_{72}$ having an arrangement as in the example described above and advantageously of the normally off type. The detection circuit 70 includes an input transistor M$_{71}$, here of the normally on type, receiving the measurement signal V$_{sense}$, either on its gate or on its source corresponding respectively to a first input INp, and to a second input INn of the circuit. Among the inputs, INn, INp, the one that is not used and therefore does not receive the measurement signal V$_{sense}$ can be set to a reference potential, in this case to ground GND.

When it is desired to detect a positive current, the first input INp is coupled to the detection node N$_1$, while the second input INn is coupled to the detection node N$_1$ when it is desired to detect a negative current.

In order to obtain high gain amplification, the detection circuit 70 is in this example further provided with a transistor M$_{74}$ connected as a current source and forming an active load coupled to the gate of the comparator transistor M$_{72}$.

In order to be able to detect both a positive and a negative current, it may be provided to duplicate the detection circuit 70 as described above.

Figure 10:
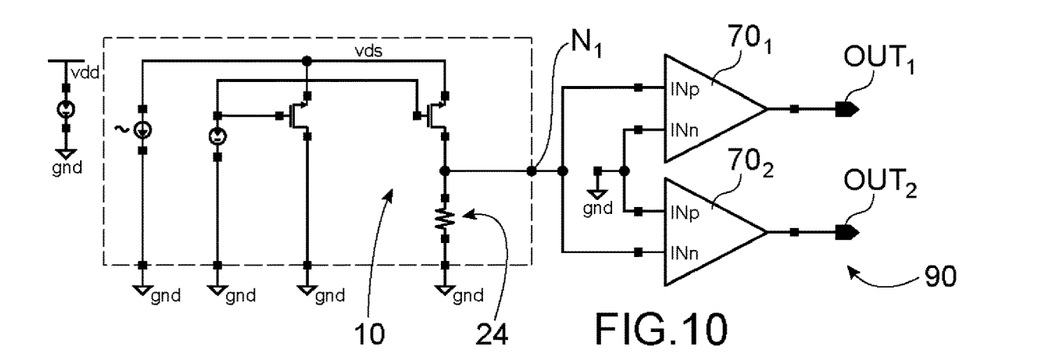
FIG. 10 is used to illustrate a current detection device fitted with two detection circuits as illustrated in FIG. 9, one adapted for negative current detection, the other adapted for positive current detection.

In the example illustrated in FIG. 10, the detection device thus includes a first detection circuit 70$_1$ of the type illustrated in FIG. 7 associated with a second detection circuit 70$_2$ of the type illustrated in FIG. 7. The first detection circuit 70$_1$ has an input INp which receives the measurement signal V$_{sense}$ and outputs a two-state signal OUT1 for indicating when a positive current is detected. The second detection circuit 70$_2$ has an input INn which receives the measurement signal V$_{sense}$ and outputs a two-state signal OUT2 for indicating when a negative current is detected.

In either of the examples described above, the detector is able to detect the polarity of an alternating current.

A detector with transistors according to any of the previously described embodiments may also be adapted to detect a polarity of an alternating voltage. Thus, in the exemplary embodiment shown in FIG. 11, a detection circuit of the type illustrated in FIG. 10 and described previously is used to indicate the polarity of an alternating voltage VAC, for example an alternating voltage at the input to a power converter. The detection device thus includes a first detection circuit 70$_1$ of the type illustrated in FIG. 7 associated with a second detection circuit 70$_2$ of the type illustrated in FIG. 7. The first detection circuit 70$_1$ has an input INp coupled to the detection node N$_1$ and outputs a two-state signal OUT1 for indicating when the voltage VAC between two nodes NA, NB is positive, the second detection circuit having an input INn coupled to the detection node N$_1$ and outputs a two-state signal OUT2 for indicating when the voltage VAC is negative. A measurement signal V$_{sense}$ at node N$_1$ is in this example obtained by limiting the alternating voltage VAC. A voltage limiter 117 is thus provided between node N$_1$ and node NB. Advantageously, a clipping of the node NA can also be implemented by means of a clipper 116, especially when the voltage VAC is of large amplitude compared to the supply voltage of the detection circuits 70. The clipper stage can thus make it possible to absorb a large part of the voltage between nodes NA and NB in order to have a voltage V$_{sense}$ which is between ground and the supply voltage of the detection circuits 70, thus making it possible to use "low voltage" transistors, which are more compact and less expensive, for making the circuits 70.

Figure 11:
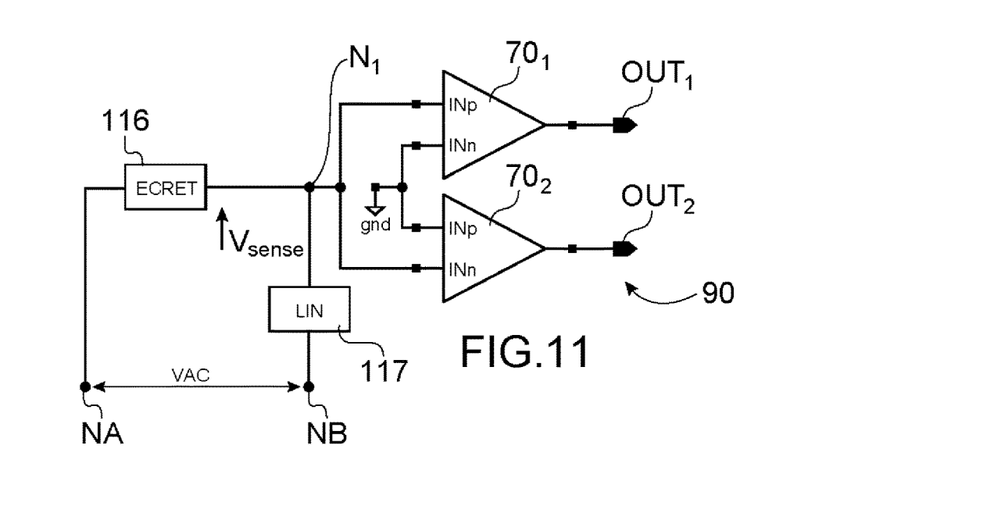
FIG. 11 is used to illustrate an exemplary device for detecting the polarity of an alternating voltage.

Thus, there is an alternating voltage VAC supplied between two nodes NA and NB, and at least one component in series between these nodes NA and NB and a portion of the detection circuit provided with a node N$_1$ supplying an alternating signal, here a voltage V$_{sense}$ which is the image of a fraction of the voltage VAC and having a polarity depending on the direction of this voltage VAC.

The invention claimed is:

1. A device for detecting the polarity of an alternately positive and negative detected current or of an alternately positive or negative detected voltage, the detection device being configured to indicate the polarity of the detected current or of the detected voltage, the detection device comprising:
   a circuit portion provided with a detection node configured to produce at the detection node a measurement voltage image of a fraction of the detected current or of the detected voltage, and
   at least one detection circuit with transistor(s), coupled to the detection node, the at least one detection circuit being provided with one or more amplifier stage(s), at least one of the amplifier stages comprising a comparator transistor having a gate-source voltage which depends on the measurement voltage,
   the comparator transistor further having a source set at a fixed potential and a gate-source voltage which depends on the measurement voltage or a gate set at a fixed potential and a gate-source voltage which depends on the measurement voltage,
   the at least one detection circuit further comprising an output transistor having a drain coupled to an output, the output transistor having a gate coupled to the drain of the comparator transistor, and
   the at least one detection circuit being configured to compare the measurement voltage with a determined threshold, and produce at the output a binary detection signal indicative of the polarity of the detected current or of the detected voltage, the detection adopting a first state when the measurement voltage is below the determined threshold and adopting a second state when the measurement voltage is above the determined threshold, wherein the detection node is coupled to a source of an input transistor of the detection circuit or to the source of the comparator transistor, and wherein the input transistor, the comparator transistor, and the output transistor of the detection circuit are of the N type and normally blocked.

2. The detection device according to claim 1, wherein the at least one detection circuit produces on the output a detection signal indicative of a positive polarity, the amplifier stages forming a positive-gain amplification chain, the detection node being coupled to the source of the input transistor of the detection circuit, the input transistor being provided with a drain electrode coupled to the gate of the comparator transistor, and the comparator transistor having a source set at a fixed potential.

3. The detection device according to claim 2, comprising the input transistor being mounted as a diode.

4. The detection device according to claim 1, wherein the detection node is coupled to the source of the comparator transistor and wherein the at least one detection circuit produces at the output a detection signal indicative of a detection of a negative polarity, the amplifier stages(s) forming a negative-gain amplification chain.

5. The detection device according to claim 4, wherein the gate of the comparator transistor is coupled to a transistor mounted as a diode.

6. The detection device according to claim 5, wherein the detection node is coupled to the gate of the input transistor of the at least one detection circuit, the input transistor having a drain coupled to the gate of the comparator transistor.

7. The detection device according to claim 1, wherein the detection node is coupled to a source electrode of the input transistor of the at least one detection circuit, the input transistor being provided with a drain electrode coupled to the gate of the comparator transistor and to a transistor forming an active load.

8. The detection device according to claim 1, wherein the at least one detection circuit produces a detection signal indicative of a positive polarity, the device being provided with at least one second detection circuit, the at least one second detection circuit having transistor(s) being provided with at least one amplification stage comprising at least one comparator transistor whose gate-source voltage depends on the measurement voltage, the at least one second detection circuit being configured to compare the measurement voltage with a predetermined second threshold and produce at the output another detection signal, and the other detection signal being a two-state signal able to indicate a negative polarity.

9. The detection device according to claim 8, wherein the at least one detection circuit and the at least one second detection circuit are configured with a dead zone detection range corresponding to current values around a zero value, which are not detected.

10. The detection device according to claim 1, further comprising a circuit for biasing the transistors of the at least one detection circuit, the biasing circuit being supplied by a positive power supply voltage.

11. The detection device according to claim 1, wherein the alternating current is derived from a power transistor coupled to the circuit portion, the power transistor being a HEMT transistor provided with a GaN-based channel, the transistor(s) of the at least one detection circuit also being HEMT transistors provided with a channel structure formed in a GaN layer.

12. The detection device according to claim 1, wherein
the detected alternating current is derived from a power transistor coupled to the circuit portion, the device further comprising the power transistor, and
the power transistor, the circuit portion, and the at least one detection circuit being integrated on a same substrate.

13. The detection device according to claim 1, wherein the at least one detection circuit consists of N-type transistors and biasing loads consisting of resistors and/or transistors.

* * * * *